United States Patent
Chih et al.

(10) Patent No.: US 9,564,357 B2
(45) Date of Patent: Feb. 7, 2017

(54) METHOD OF FORMING SEMICONDUCTOR DEVICE USING ETCH STOP LAYER

(71) Applicant: Taiwan Semiconductor Manufacturing Company Limited, Hsin-Chu (TW)

(72) Inventors: Fang-I Chih, Tainan (TW); Yen-Chang Chao, Taichung (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 93 days.

(21) Appl. No.: 14/162,796

(22) Filed: Jan. 24, 2014

(65) Prior Publication Data

US 2015/0214071 A1 Jul. 30, 2015

(51) Int. Cl.
| H01L 21/76 | (2006.01) |
| H01L 21/768 | (2006.01) |
| H01L 29/78 | (2006.01) |
| H01L 21/3105 | (2006.01) |
| H01L 21/311 | (2006.01) |
| H01L 21/3115 | (2006.01) |

(52) U.S. Cl.
CPC ... *H01L 21/76831* (2013.01); *H01L 21/31056* (2013.01); *H01L 21/31111* (2013.01); *H01L 21/31116* (2013.01); *H01L 29/785* (2013.01); *H01L 21/31155* (2013.01)

(58) Field of Classification Search
CPC .................................................. H01L 21/76831
USPC ....................................................... 438/400
See application file for complete search history.

(56) References Cited

U.S. PATENT DOCUMENTS

| 4,571,819 A * | 2/1986 | Rogers .............. H01L 21/76224 |
| | | 148/DIG. 133 |
| 5,414,276 A * | 5/1995 | McCarthy ........... H01L 21/2007 |
| | | 257/57 |
| 2002/0192852 A1* | 12/2002 | Scharf .................. B81C 1/00666 |
| | | 438/52 |
| 2007/0057325 A1* | 3/2007 | Hsu ........................ H01L 29/785 |
| | | 257/347 |

(Continued)

FOREIGN PATENT DOCUMENTS

| TW | 200802817 | 1/2008 |
| TW | 201434155 | 9/2014 |

OTHER PUBLICATIONS

Unagami, Takashi, "Interface Characteristics of SiO2 ÖSi Structure with High Energy Boron Implantation", Journal of the Electrochemical Society, 149 (9) pp. G539-G542, 2002.

(Continued)

*Primary Examiner* — Ajay K Arora
(74) *Attorney, Agent, or Firm* — Cooper Legal Group, LLC

(57) ABSTRACT

A semiconductor device and method of formation are provided. A semiconductor device includes a first material comprising STI adjacent a fin. The STI is substantially uniform, such that a top surface of the STI has few to no defects and little to no concavity. To form the STI, the first material is implanted with a dopant, which forms an etch stop layer, such that the first material height is reduced by etching rather than CMP. Etching results in a better uniformity of the first material than CMP. STI that is substantially uniform comprises a better current barrier between adjacent fins than a device that comprises STI that is not substantially uniform.

20 Claims, 6 Drawing Sheets

(56) References Cited

U.S. PATENT DOCUMENTS

2008/0121042 A1* 5/2008 Miller .................. B81B 3/0078
                                                                          73/649

OTHER PUBLICATIONS

Corresponding Taiwan Application, Taiwan Office action dated Dec. 16, 2015, 5 pages.

* cited by examiner

METHOD OF FORMING SEMICONDUCTOR DEVICE USING ETCH STOP LAYER

BACKGROUND

During fabrication of a semiconductor device, chemical mechanical planarization (CMP) is performed to smooth surfaces of the semiconductor device using chemicals and/or mechanical forces. For example, the semiconductor device can be polished to prepare the semiconductor device for a new layer of material. In one example of polishing, the semiconductor device can be secured to a polishing head configured to hold and rotate the semiconductor device. The polishing head can rotate the semiconductor device against a polishing pad, which can also be rotating, to apply mechanical force to the semiconductor device to remove material and/or even out irregular topography of the semiconductor device, for example. In one example, chemicals, such as slurry (e.g., colloid), can be applied to the polishing pad during polishing to serve as solvents which aid in reducing non-uniformities on the surface of the semiconductor device.

Additionally, during fabrication of a semiconductor device, etching, such as chemical etching, is performed to remove material from the semiconductor device. Chemical etching is selective, such that different etch chemistries remove different materials. For example, one etch chemistry removes silicon oxide but not silicon nitride.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
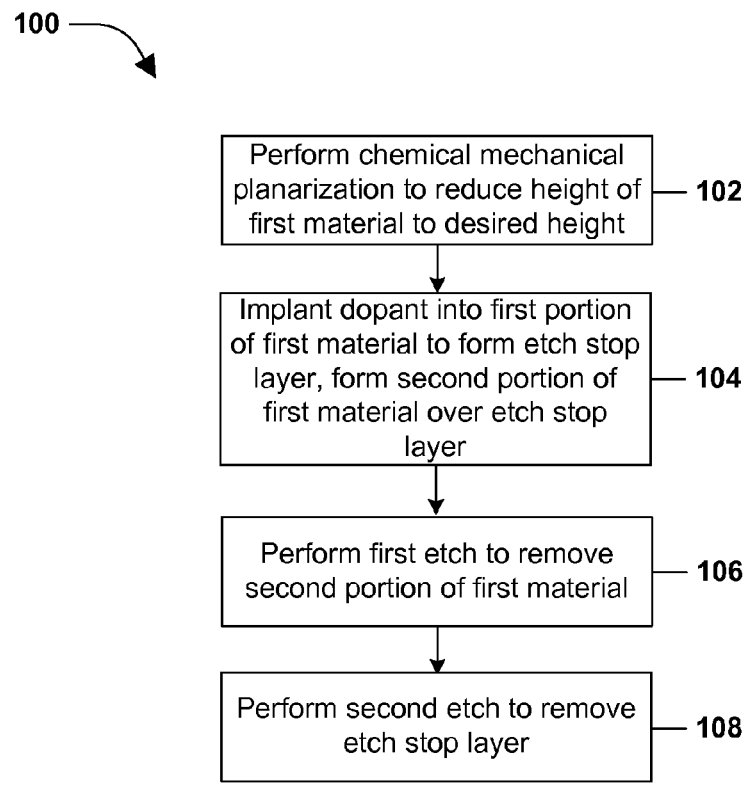
FIG. 1 is a flow diagram that illustrates a method of forming a semiconductor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 4:
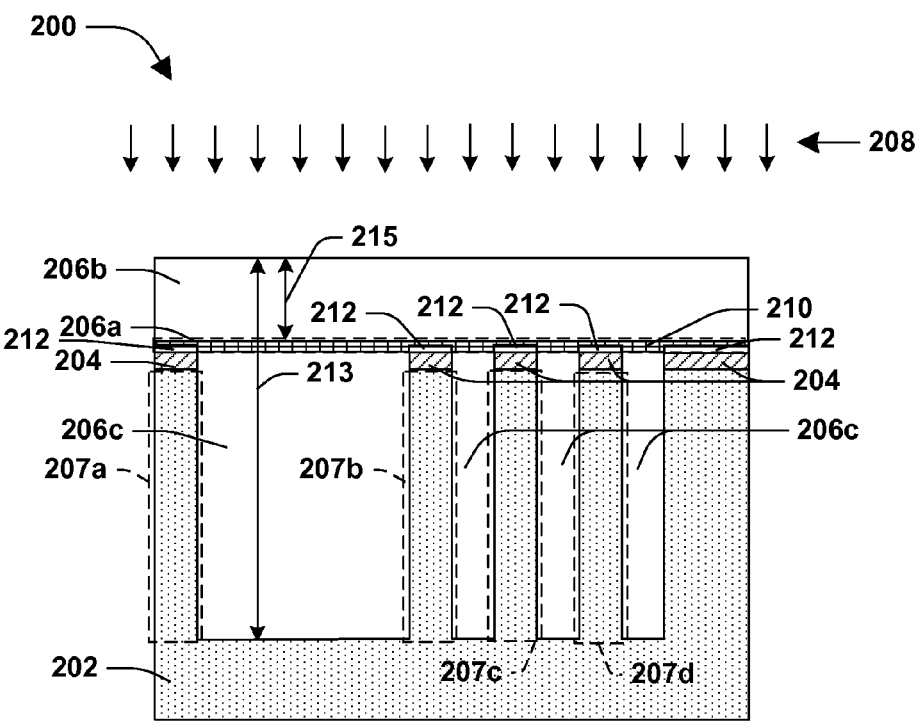
FIG. 4 is an illustration of a semiconductor device, in accordance with some embodiments.
Figure 5:
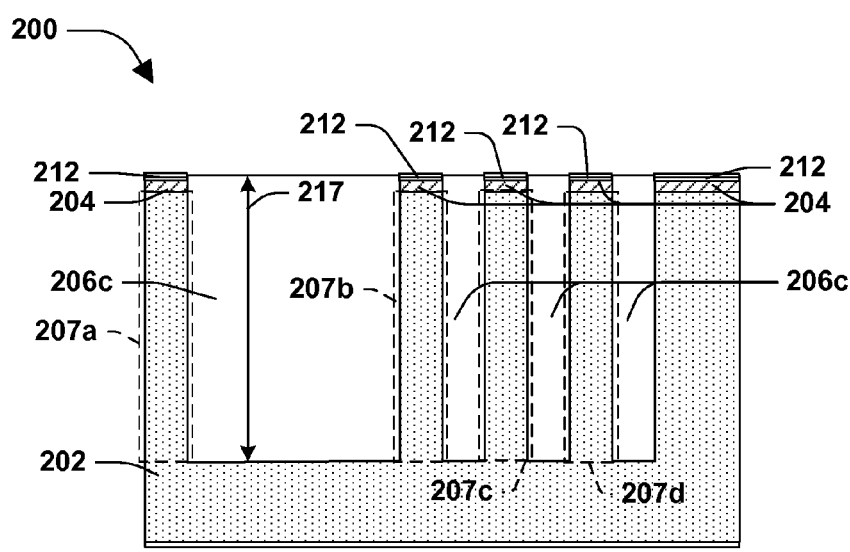
FIG. 5 is an illustration of a semiconductor device, in accordance with some embodiments.
Figure 6:
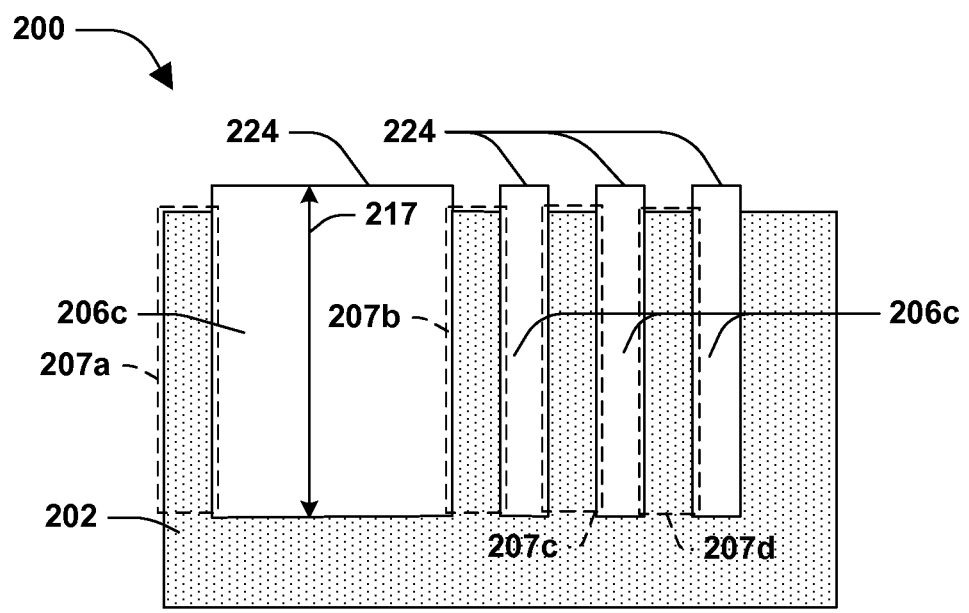
FIG. 6 is an illustration of a semiconductor device, in accordance with some embodiments.

A method 100 of forming a semiconductor device 200 according to some embodiments is illustrated in FIG. 1 and one or more structures formed thereby at various stages of fabrication are illustrated in FIGS. 2-10. According to some embodiments, a semiconductor device 200 comprises STI comprising a first material 206, as illustrated in FIG. 6. In some embodiments, the first material 206 is adjacent a first fin 207a. In some embodiments, the semiconductor device 200 comprises a FinFet. In some embodiments, the STI is substantially uniform, where substantially uniform comprises a surface that has few to no defects, little to no cupping, dishing or erosion, and where the top surface 224 of the STI has little to no concavity. In some embodiment, concavity comprises a surface having an external angle other than about 180°, where the angle is measured relative to any two coordinates of the surface, such as any two coordinates of the top surface 224 of the STI. In some embodiments, the top surface 224 of the STI comprises a dopant concentration between about $1 \times 10^2$ ions/cm$^2$ to about $1 \times 10^7$ ions/cm$^2$. In some embodiments, the dopant comprises boron. In some embodiments, STI that is substantially uniform comprises a better current barrier between adjacent fins than a device that comprises STI that is not substantially uniform.

Figure 2:
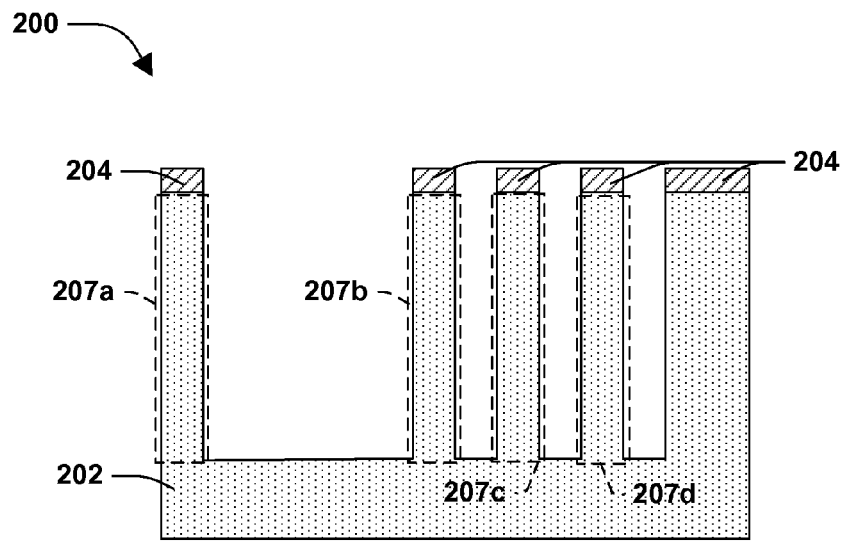
FIG. 2 is an illustration of a semiconductor device, in accordance with some embodiments.
Figure 3:
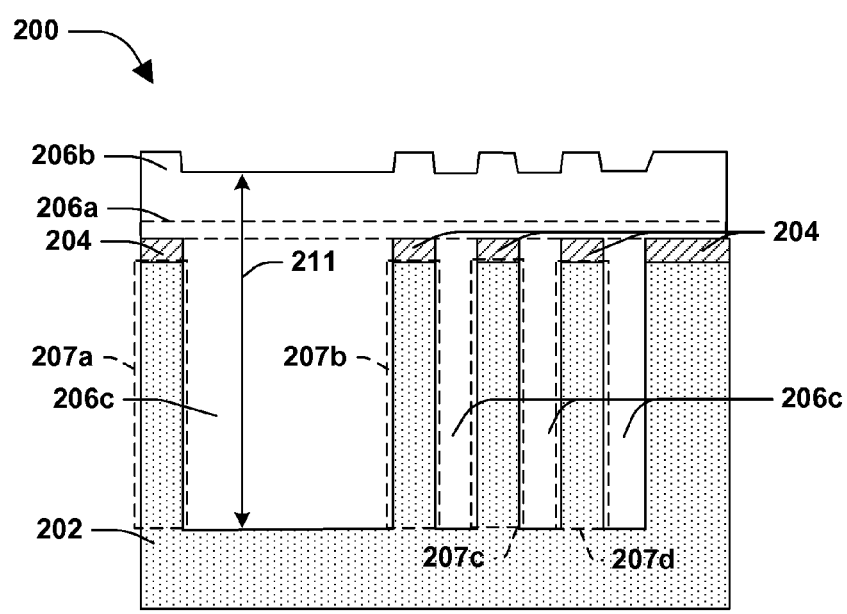
FIG. 3 is an illustration of a semiconductor device, in accordance with some embodiments.

At 102, chemical mechanical planarization (CMP) is performed on the first material 206 to reduce a height 211 of the first material 206, as illustrated in FIG. 3, to a desired height 213 of the first material 206, as illustrated in FIG. 4, according to some embodiments. Turning to FIG. 2, prior to FIG. 3, a hard mask 204 is over a first fin 207a, a second fin 207b, a third fin 207c and a fourth fin 207d, collectively referred to as the fins 207. In some embodiments, the fins 207 comprise a substrate 202, or rather are formed from a substrate, such as via etching. In some embodiments, the substrate 202 comprises at least one of silicon, germanium, a group 3 element or a group 5 element. According to some embodiments, the substrate 202 comprises at least one of an epitaxial layer, a silicon-on-insulator (SOI) structure, a wafer, or a die formed from a wafer. In some embodiments, the substrate 202 comprises at least one of a first conductivity type or a second conductivity type. In some embodiments, the first conductivity type is at least one of a p-type or an n-type. In some embodiments, the second conductivity type is p-type if the first conductivity type is n-type and the second conductivity type is n-type if the first conductivity type is p-type. In some embodiments, the hard mask 204 comprises a nitride. In some embodiments, the hard mask 204 has a thickness between about 1 nm to about 10 nm. In some embodiments, a first material 206 is deposited, such as by chemical vapor deposition (CVD), over and between the fins 207, as illustrated in FIG. 4. In some embodiments, the first material 206 comprises at least one of nitride or oxide. In some embodiments, the CMP planerizes the first material 206. In some embodiments, the height 211 of the first material 206, as illustrated in FIG. 3, is reduced such that a second thickness 215 of a second portion 206b of the first material 206 is about 1 µm to about 1 nm.

At 104, an implant 208 of a dopant into a first portion 206a of the first material 206 to form an etch stop layer 210 is performed, such that the etch stop layer 210 separates the second portion 206b of the first material 206 from a third portion 206c of the first material 206, as illustrated in FIG. 4, according to some embodiments. In some embodiments, the implant 208 of the dopant comprises implanting a dose of the dopant at a concentration of about $1 \times 10^{12}$ ions/cm$^2$ to about $2 \times 10^{12}$ ions/cm$^2$ at an implant energy of about 0.1 MeV to about 20 MeV. In some embodiments, the implant energy is altered to implant the dopant in the first portion 206a of the first material 206, where the first portion 206a of the first material 206 is substantially on the same plane as a top surface of the hard mask 204. In some embodiments, the implant energy, and thus the implant depth, is altered to form the etch stop layer 210 at a desired depth. In some embodiments, the dopant comprises boron. In some embodiments, the etch stop layer 210 has an etch stop layer thickness between about 0.1 µm to 10 µm. In some embodiments, the dopant is implanted in the hard mask 204, such that a doped portion 212 of the hard mask 204 is over an undoped portion of the hard mask 204. In some embodiments, a surface state density of the dopant in the first portion 206a of the first material 206 is about $1 \times 10^{11}$ ions/cm$^2$ to about $5 \times 10^{11}$ ions/cm$^2$. In some embodiments, the semiconductor device 200 is heated at first temperature between about 800° C. to about 1,200° C. in a chamber for a first duration between about 40 min to about 80 min. In some embodiments, the chamber contains nitrogen. In some embodiments, the surface state density of the dopant in the first portion 206a of the first material 206 is reduced to about $0.5 \times 10^{11}$ ions/cm$^2$ to about $2 \times 10^{11}$ ions/cm$^2$ after heating to the first temperature for the first duration.

At 106, a first etch is performed to remove the second portion 206b of the first material 206, as illustrated in FIG. 5, according to some embodiments. In some embodiments, the first etch comprises etching with at least one of KOH, EDP (ethylenediamine/pyrocatechol/water) or hydrazine. In some embodiments, the first etch comprises etching with an etchant that exhibits etch selectivity between the first material 206 and the etch stop layer 210.

At 108, a second etch is performed to remove the etch stop layer 210, as illustrated in FIG. 5, according to some embodiments. In some embodiments, the second etch comprises etching with at least one of nitrogen trifluoride, hydrogen bromide, sulfur hexafluoride, hydrogen bromide or dioxygen. In some embodiments, the second etch comprises etching with an etchant that exhibits etch selectivity between the etch stop layer 210 and the first material 206, such that little to none of the first material 206 is etched by the second etch. In some embodiments, the second etch removes the hard mask 204, as illustrated in FIG. 6. In some embodiments, a third etch is performed to remove the hard mask 204. In some embodiments, the third etch comprises at least one of nitrogen trifluoride, hydrogen bromide, sulfur hexafluoride, hydrogen bromide or dioxygen. In some embodiments, the third portion 206c of the first material 206 comprises STI. In some embodiments, the STI is substantially uniform, where substantially uniform comprises a top surface that has few to no defects, little to no cupping, dishing or erosion, and where the top surface 224 of the STI has little to no concavity. In some embodiments, the top surface 224 of the STI comprises a dopant concentration between about $1 \times 10^2$ ions/cm$^2$ to about $1 \times 10^7$ ions/cm$^2$. In some embodiments, STI that is substantially uniform comprises a better current barrier between adjacent fins than a device that comprises STI that is not substantially uniform.

Figure 7:
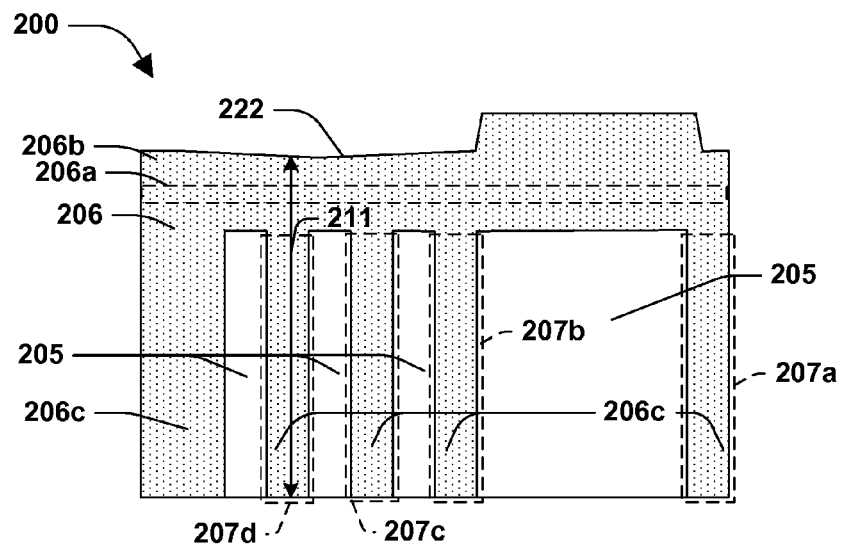
FIG. 7 is an illustration of a semiconductor device, in accordance with some embodiments.

According to some embodiments, FIGS. 7-10 are formed by substantially the same method as FIGS. 2-6. In some embodiments, FIG. 7 illustrates an inverted semiconductor device 200, such that a backside 222 of the semiconductor device 200 is over the fins 207. In some embodiments, FIG. 7 comprises a second material 205 under the first material 206. In some embodiments, the second material 205 comprises at least one of oxide or nitride. In some embodiments, the first material 206 comprises at least one of nitride, oxide, silicon or germanium.

Figure 8:
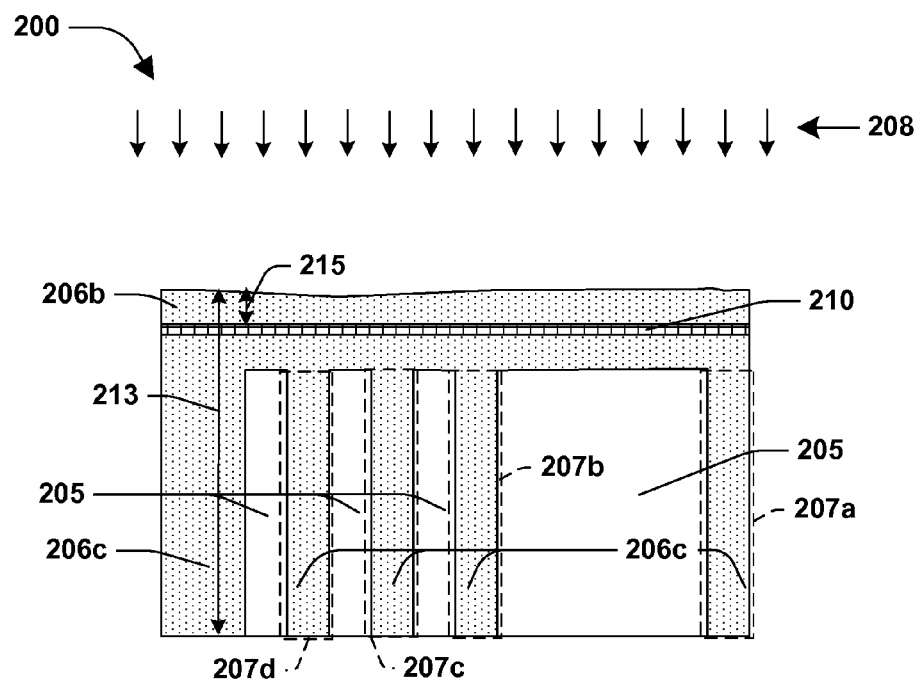
FIG. 8 is an illustration of a semiconductor device, in accordance with some embodiments.

At 102, CMP is performed on the first material 206 to reduce a height 211 of the first material 206, as illustrated in FIG. 7, to a desired height 213 of the first material 206, as illustrated in FIG. 8, according to some embodiments. In some embodiments, the CMP is preformed in substantially the same manner as described above with regard to the CMP performed in FIGS. 3-4.

At 104, an implant 208 of a dopant into the first portion 206a of the first material 206 to form an etch stop layer 210 is performed, such that the etch stop layer 210 separates the second portion 206b of the first material 206 from the third portion 206c of the first material 206, as illustrated in FIG. 8, according to some embodiments. In some embodiments, the implant 208 is preformed in substantially the same manner as described above with regard to the implant 208 performed in FIG. 4.

Figure 9:
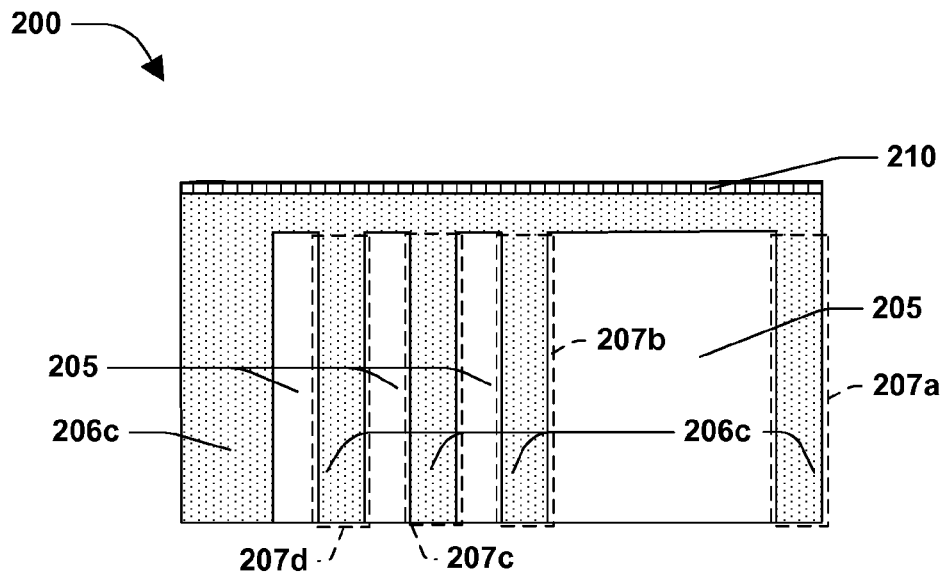
FIG. 9 is an illustration of a semiconductor device, in accordance with some embodiments.

At 106, a first etch is preformed to remove the second portion 206b of the first material 206, as illustrated in FIG. 9, according to some embodiments. In some embodiments, the first etch is preformed in substantially the same manner as described above with regard to the first etch performed in FIG. 5.

Figure 10:
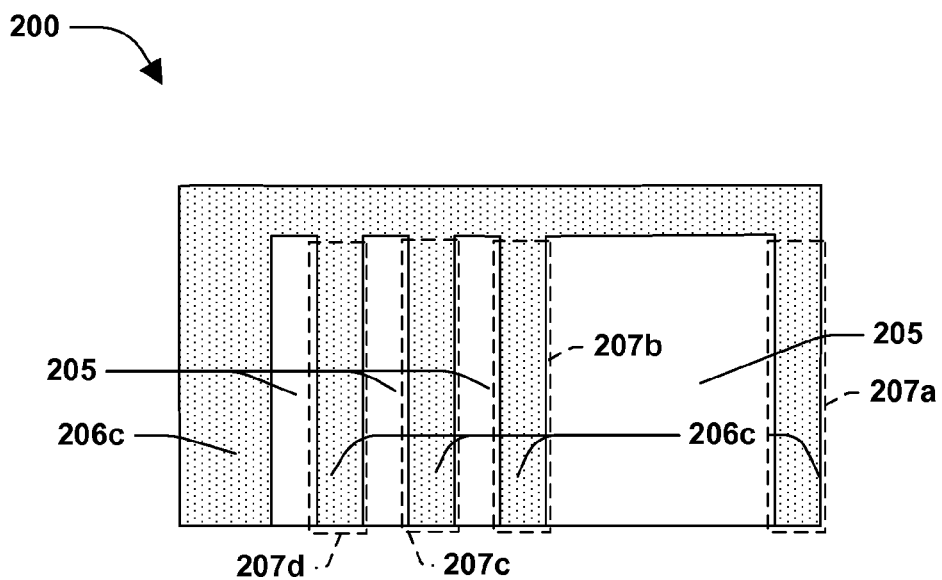
FIG. 10 is an illustration of a semiconductor device, in accordance with some embodiments.

At 108, a second etch is performed to remove the etch stop layer 210, as illustrated in FIG. 10, according to some embodiments. In some embodiments, the second etch is preformed in substantially the same manner as described above with regard to the second etch performed in FIG. 5. In some embodiments, a third etch, if needed, is performed in substantially the same manner as described above with regard to the third etch performed in FIG. 6.

According to some embodiments, a method of forming a semiconductor device comprises implanting a dopant into a first portion of a first material to form an etch stop layer from the dopant and the first portion of the first material, a second portion of the first material over the etch stop layer and a third portion of the first material under the etch stop layer. In some embodiments, the first material comprises at least one of oxide or nitride.

According to some embodiments, a semiconductor device comprises a FinFet comprising a first fin and STI comprising a first material. In some embodiments, the STI is adjacent the first fin and a top surface of the STI comprises a concentration of boron between about $1 \times 10^2$ ions/cm$^2$ to about $1 \times 10^7$ ions/cm$^2$.

According to some embodiments, a method of forming a semiconductor device comprises implanting a dopant into a first portion of a first material to form an etch stop layer from the dopant and the first portion of the first material, a second portion of the first material over the etch stop layer and a third portion of the first material under the etch stop layer. In some embodiments, the first material comprises at least one of oxide or nitride. In some embodiments, the method of forming a semiconductor device further comprises performing a first etch to remove the second portion of the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device comprising:
    forming a hard mask over a semiconductor structure;
    forming a dielectric material over the hard mask and in a trench adjacent a sidewall of the hard mask; and
    implanting a dopant into a first portion of the hard mask and a first portion of the dielectric material, wherein an etch stop layer is formed from the dopant and the first portion of the dielectric material, a second portion of the dielectric material is over the etch stop layer and a third portion of the dielectric material is under the etch stop layer.

2. The method of claim 1, the implanting a dopant comprising implanting a dose of about $1 \times 10^{12}$ ions/cm$^2$ to about $2 \times 10^{12}$ ions/cm$^2$.

3. The method of claim 1, the implanting a dopant comprising implanting the dopant at an energy of about 0.1 MeV to about 20 MeV.

4. The method of claim 1, the implanting a dopant comprising implanting boron.

5. The method of claim 1, comprising performing a first etch to remove the second portion of the dielectric material.

6. The method of claim 5, the performing a first etch comprising etching with at least one of KOH, EDP or hydrazine.

7. The method of claim 5, comprising performing a second etch to remove the etch stop layer.

8. The method of claim 7, the performing a second etch comprising etching with at least one of nitrogen trifluoride, hydrogen bromide, sulfur hexafluoride, or dioxygen.

9. The method of claim 1, comprising performing chemical mechanical planarization on the dielectric material prior to the implanting.

10. The method of claim 1, wherein the semiconductor structure comprises a first fin and wherein the dielectric material is formed between the first fin and a second fin and over the first fin and the second fin.

11. A method of forming a semiconductor device comprising:
    forming a dielectric material between a first fin of a semiconductor substrate and a second fin of the semiconductor substrate and over the first fin and the second fin;

implanting a dopant into a first portion of the dielectric material to form an etch stop layer from the dopant and the first portion of the dielectric material, a second portion of the dielectric material over the etch stop layer and over the first fin and a third portion of the dielectric material under the etch stop layer and between the first fin and the second fin;

performing a first etch to remove the second portion of the dielectric material; and performing a second etch to remove the etch stop layer.

12. The method of claim 11, the implanting a dopant comprising implanting a dose of about $1\times10^{12}$ ions/cm$^2$ to about $2\times10^{12}$ ions/cm$^2$.

13. The method of claim 11, the implanting a dopant comprising implanting the dopant at an energy of about 0.1 MeV to about 20 MeV.

14. The method of claim 11, the implanting a dopant comprising implanting boron.

15. The method of claim 11, the performing a first etch comprising etching with at least one of KOH, EDP or hydrazine.

16. The method of claim 11, comprising forming a hard mask over the first fin prior to the forming a dielectric material, wherein the implanting comprises:

implanting the dopant into a first portion of the hard mask.

17. The method of claim 11, the performing a second etch comprising etching with at least one of nitrogen trifluoride, hydrogen bromide, sulfur hexafluoride, or dioxygen.

18. The method of claim 11, comprising performing chemical mechanical planarization on the dielectric material prior to the implanting.

19. A method of forming a semiconductor device comprising:

forming a hard mask over a semiconductor structure;

depositing a dielectric material around the semiconductor structure after forming the hard mask;

implanting a dopant at a specified depth within a first portion of the hard mask to form a doped region of the hard mask and within a first portion of the dielectric material to form a doped region of the dielectric material; and removing an undoped portion of the dielectric material above the doped region of the dielectric material, the doped region of the dielectric material serving as an etch stop layer.

20. The method of claim 19, comprising heating the doped region of the dielectric material to reduce a density of the dopant within the doped region of the dielectric material.

* * * * *